United States Patent

Rezvani et al.

Patent Number: 5,809,034
Date of Patent: Sep. 15, 1998

[54] APPARATUS AND METHOD FOR OPERATING ELECTRONIC DEVICE TESTING EQUIPMENT IN ACCORDANCE WITH A KNOWN OVERALL TIMING ACCURACY PARAMETER

[75] Inventors: Saiid Rezvani, Los Gatos; Anh Nguyen, Santa Clara, both of Calif.

[73] Assignee: Altera Corporation, San Jose, Calif.

[21] Appl. No.: 742,072

[22] Filed: Oct. 31, 1996

Related U.S. Application Data

[60] Provisional application No. 60/027,381 Sep. 27, 1996.
[51] Int. Cl.⁶ .............................. G06K 5/04; G11B 5/00
[52] U.S. Cl. .................................. 371/1; 371/62
[58] Field of Search ..................... 371/1, 61, 62

[56] References Cited

U.S. PATENT DOCUMENTS 5,436,908  7/1995  Fluker et al. ............................... 371/1

*Primary Examiner*—Phung M. Chung
*Attorney, Agent, or Firm*—Flehr Hohbach Test Albritton & Herbert LLP; William S. Galliani

[57] ABSTRACT

A method of operating electronic device test equipment in accordance with a known overall timing parameter includes the step of identifying a first set of time delays between a first set of electrically shorted test pads. A second set of time delays is measured between a second set of electrically shorted test pads. A bridge time delay is then obtained between a third set of electrically shorted test pads; the third set of electrically shorted test pads is selected such that the third bridge time delay characterizes the timing relationship between the first set of time delays and the second set of time delays. A clock reference edge is then defined. Skew values are then generated based upon the first set of time delays, the second set of time delays, the bridge time delay, and the clock reference edge. An overall tester accuracy value is calculated from the most negative skew value and the most positive skew value of the skew values. A functional device guard band is then defined with respect to the overall tester accuracy value. Thereafter, the electronic device test equipment is operated to identify tested electronic devices that do not function within the functional device guard band. The overall tester accuracy value may also be compared to an accuracy threshold value. Calibration operations are performed on the electronic device test equipment when the overall tester accuracy value exceeds the accuracy threshold value.

9 Claims, 6 Drawing Sheets

| Edge/Pin D=Drive, C=Compare | Skew (ns) |
|---|---|
| D1 | 0 |
| C2 | −0.326 |
| D3 | 0.011 |
| C5 | −0.271 |
| D6 | −0.165 |
| C7 | −0.282 |
| D8 | −0.253 |
| C10 | −0.568 |
| D11 | −0.528 |
| C12 | −0.678 |
| D13 | −0.726 |
| C14 | −0.898 |
| D15 | −0.99 |
| C18 | −1.173 |
| D19 | −1.133 |
| C20 | −1.283 |
| D21 | −1.385 |
| C22 | −1.403 |
| D23 | −1.495 |
| C25 | −1.371 |
| D26 | −1.21 |
| C27 | −1.239 |
| D28 | −1.243 |
| C30 | −1.371 |
| D31 | −1.122 |
| C32 | −1.074 |
| D33 | −0.946 |
| C34 | −0.975 |
| D35 | −0.814 |
| C37 | −1.324 |
| D38 | −0.779 |
| C39 | −0.621 |
| D40 | −0.438 |
| C42 | −0.654 |
| D43 | −0.329 |
| C44 | −0.6 |
| C1* | −0.633 |

| | |
|---|---|
| D2 | −0.593 |
| C3 | −0.787 |
| D5 | −0.659 |
| C6 | −0.699 |
| D7 | −0.626 |
| C8 | −0.611 |
| D10 | −0.527 |
| C11 | −0.545 |
| D12 | −0.371 |
| C13 | −0.433 |
| D14 | −0.426 |
| C15 | −0.466 |
| D18 | −0.305 |
| C19 | −0.762 |
| D20 | −0.448 |
| C21 | −0.971 |
| D22 | −0.788 |
| C23 | −1.201 |
| D25 | −1.205 |
| C26 | −1.267 |
| D27 | −0.832 |
| C28 | −1.212 |
| D30 | −0.755 |
| C31 | −0.993 |
| D32 | −0.646 |
| C33 | −0.653 |
| D34 | −0.547 |
| C35 | −0.598 |
| D37 | −0.569 |
| C38 | −0.565 |
| D39 | −0.514 |
| C40 | −0.675 |
| D42 | −0.7 |
| C43 | −0.773 |
| D44 | −0.557 |
| *:derived from bridge shrt blk | |
| Min | −1.495 |
| Max | 0.011 |
| OTA | 1.506 |

*FIG. 6*

APPARATUS AND METHOD FOR OPERATING ELECTRONIC DEVICE TESTING EQUIPMENT IN ACCORDANCE WITH A KNOWN OVERALL TIMING ACCURACY PARAMETER

This application claims priority to the provisional application entitled "Apparatus and Method for Operating Electronic Device Testing Equipment in Accordance with a Known Overall Timing Accuracy Parameter", Ser. No. 60/027,381, filed Sep. 27, 1996.

BRIEF DESCRIPTION OF THE INVENTION

This invention relates generally to electronic device testing equipment. More particularly, this invention relates to a technique of operating such equipment in accordance with a known overall timing accuracy parameter.

BACKGROUND OF THE INVENTION

Electronic device testing equipment is widely used in the semiconductor industry to insure that electronic devices that are to be shipped to customers are operating as designed. Electronic device testing equipment typically includes a set of test pads. Connections are made between the test pads and the electronic device that is being tested. Thereafter, the electronic device test equipment applies a set of signals to the electronic device and monitors the resultant output generated by the electronic device. One test that is commonly performed on an electronic device is to measure the total time from sending a signal to an input pin to receiving a signal at an output pin. This timing information is critical. The timing information is only as accurate as the test equipment that is used to make the measurements. Thus, it is important to calibrate electronic device testing equipment to reduce timing errors, or to operate the equipment with accurate knowledge of the potential timing errors.

Techniques presently exist for measuring the timing error between selected test pads of electronic device testing equipment. In particular, techniques exist to measure the skew between a tester's driving edge (digital high value at an input pad) and comparing edge (digital high value at an output pad). However, there is no technique for determining the overall accuracy of electronic device testing equipment. That is, there is no technique to determine the skew between any driver edge and any comparator edge in the system. Consequently, prior art electronic device testing equipment operates without a known overall timing accuracy parameter. As a result, such prior art devices may not be calibrated when necessary or they may have to be operated through reliance upon an unnecessarily high presumed error margin.

SUMMARY OF THE INVENTION

The method of the invention includes the step of identifying a first set of time delays between a first set of electrically shorted test pads. A second set of time delays is measured between a second set of electrically shorted test pads. A bridge time delay is then obtained between a third set of electrically shorted test pads; the third set of electrically shorted test pads is selected such that the third bridge time delay characterizes the timing relationship between the first set of time delays and the second set of time delays. A clock reference edge is then defined. Skew values are then generated based upon the first set of time delays, the second set of time delays, the bridge time delay, and the clock reference edge. An overall tester accuracy value is calculated from the most negative skew value and the most positive skew value of the skew values. A functional device guard band is then defined with respect to the overall tester accuracy value. Thereafter, the electronic device test equipment is operated to identify tested electronic devices that do not function within the functional device guard band. The overall tester accuracy value may also be compared to an accuracy threshold value. Calibration operations are performed on the electronic device test equipment when the overall tester accuracy value exceeds the accuracy threshold value.

BRIEF DESCRIPTION OF THE DRAWINGS

For a better understanding of the nature and objects of the invention, reference should be made to the following detailed description taken in conjunction with the accompanying drawings, in which:

FIG. 6 illustrates skew values calculated in accordance with an example describing an embodiment of the invention.

Like reference numerals refer to corresponding parts throughout the several views of the drawings.

DETAILED DESCRIPTION OF THE INVENTION

Figure 1:
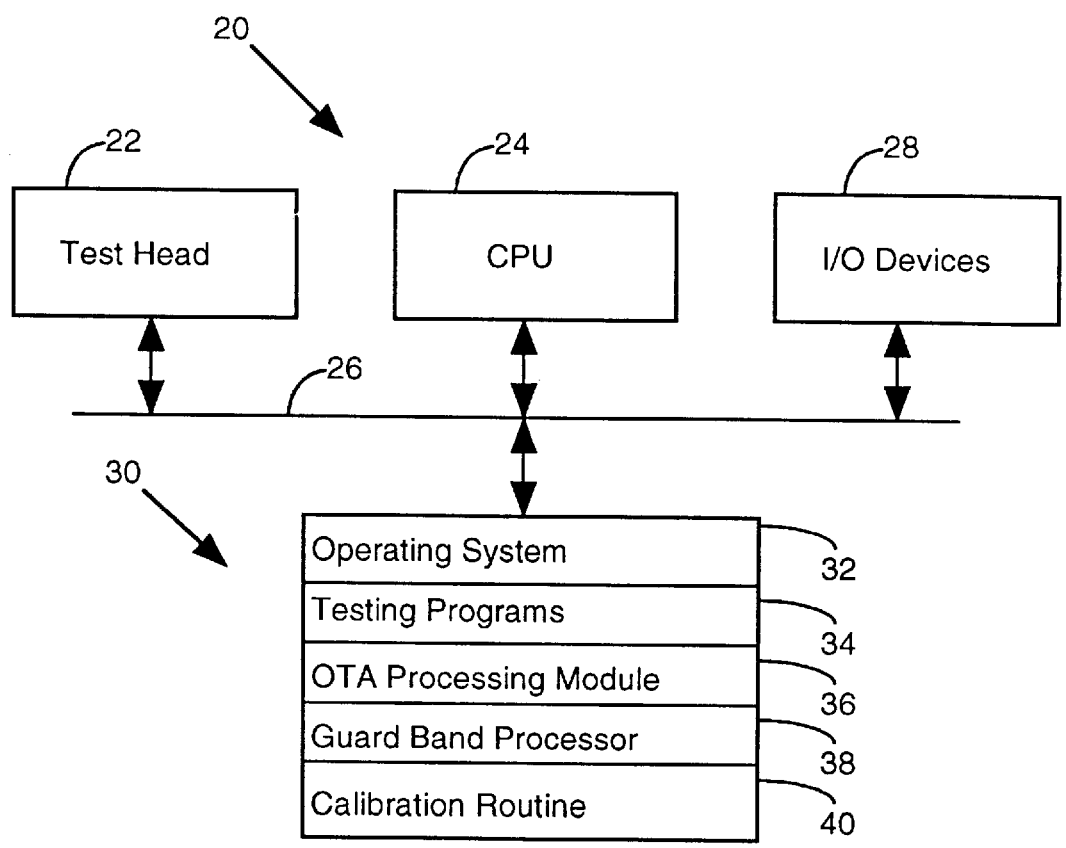
FIG. 1 illustrates electronic device test equipment in accordance with an embodiment of the invention.

FIG. 1 illustrates electronic device testing equipment 20 in accordance with an embodiment of the invention. Known electronic device testing equipment 20 may be modified to incorporate the invention. For example, the VOYAGER™ and MEGAONE™ electronic device test equipment sold by MEGATEST™, Corporation, San Jose, Calif., may be modified to incorporate and execute the invention.

FIG. 1 illustrates a number of standard features that are used in known electronic device testing equipment 20. In particular, the figure illustrates a test head 22. As known in the art, a test head 22 is used to make electrical contact with an electronic device being tested. As used herein, the test head 22 includes any equipment, such as a probe card, which might be used to establish an electrical connection with a electronic device being tested. The apparatus 20 also includes a central processing unit (CPU) 24, which controls the operation of the test head 22 via a system bus 26. The apparatus 20 also includes a standard set of input and output devices 28, for example including a keyboard, mouse, computer monitor, and printer.

The system bus 26 is also attached to a memory 30. The memory 30 stores a standard set of programs including an operating system 32 and a set of test programs 34. However, in accordance with the invention, the memory 30 is modified to include an additional set of executable programs. In particular, an Overall Timing Accuracy (OTA) processing module 36 is stored in the memory 30. As will be described below, the OTA processing module 36 identifies an overall timing accuracy value for the apparatus 20. This value is then used to modify the operation of the apparatus 20. For example, a guard band processor 38 may use the value to define a functional device guard band. The apparatus 20 is then operated to identify electronic devices that do not function within the functional device guard band. A calibration routine 40 may also use the overall timing accuracy value to determine when to perform calibration operations on the electronic device test equipment 20.

Figure 2:
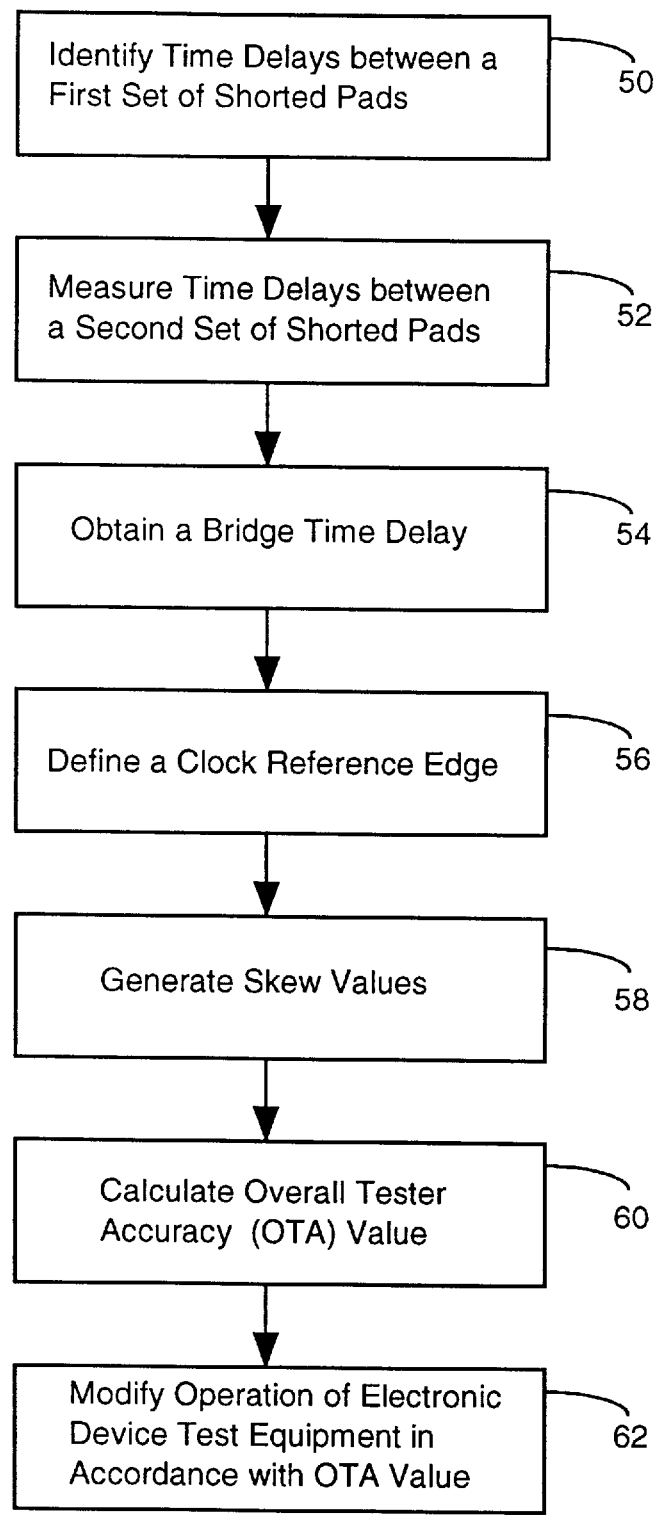
FIG. 2 illustrates the processing associated with an embodiment of the method of the invention.
Figure 3:
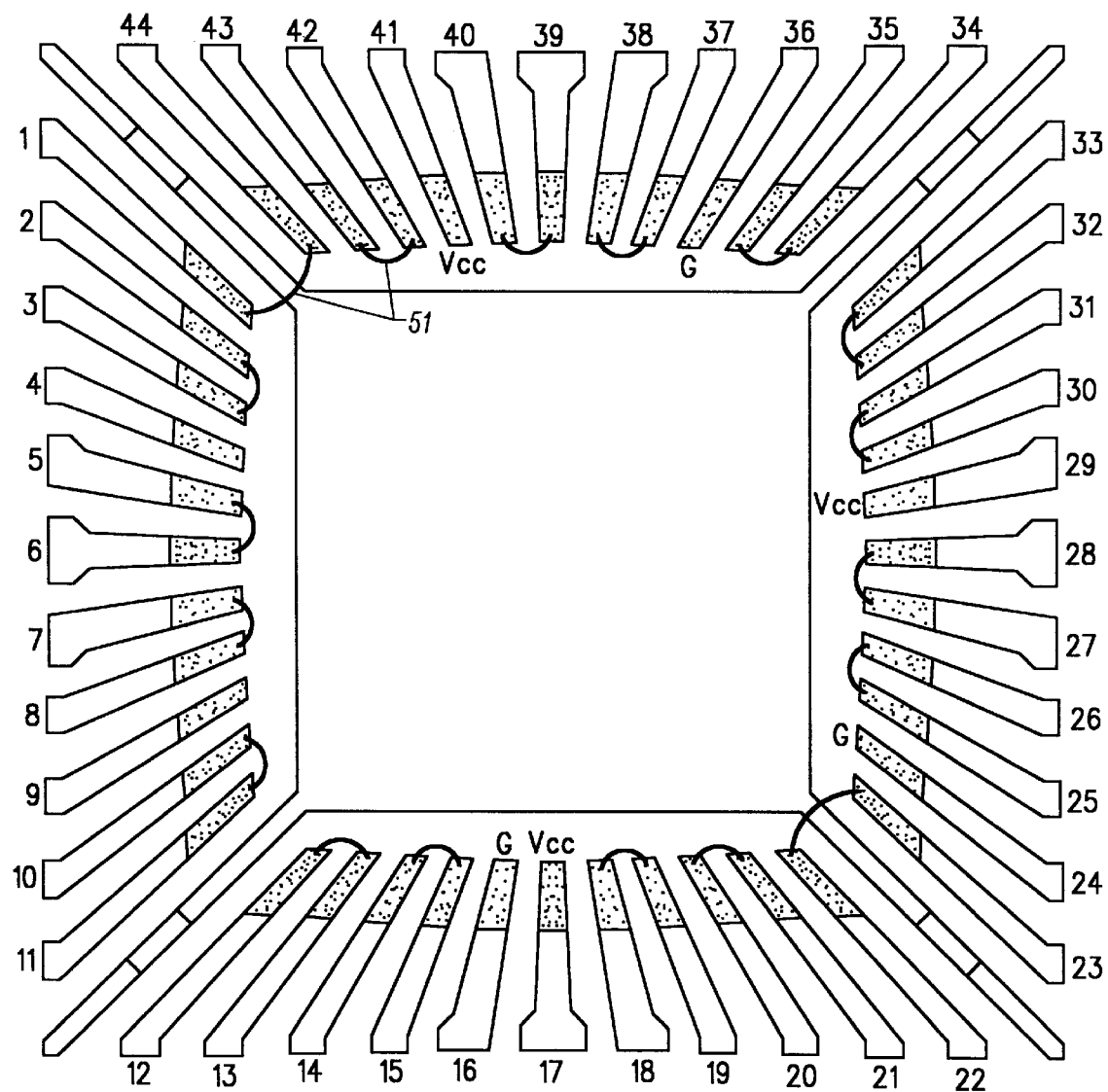
FIG. 3 illustrates a first set of shorted signal pads in accordance with an example describing an embodiment of the invention.

FIG. 2 illustrates a set of processing steps performed by one embodiment of the OTA processing module 36. The first processing step is to identify the time delays between a first set of shorted signal pads (step 50). FIG. 3 illustrates signal pads numbered 1 through 44. The figure also illustrates a bond wire 51 positioned between selected pads. The bond wire effectively shorts the two pads together. Thus, there should be no appreciable delay between the two pads. FIG. 3 illustrates a bond wire between pads 2 and 3, between pads 5 and 6, between pads 7 and 8, etc. The time delay for each connection is calculated using Equation 1:

Comparator Edge for Pin #–Driver Edge for Pin #= Delay.

Using Equation 1, the connections shown in FIG. 3, and actual measured results (in nanoseconds), the following equations can be written:

```
C44 - D1  = -0.249      =>      D1  = C44 + 0.249
C2  - D3  = -0.337      =>      D3  = C2  + 0.337
C5  - D6  = -0.106      =>      D6  = C5  + 0.106
C7  - D8  = -0.029      =>      D8  = C7  + 0.029
C10 - D11 = -0.04       =>      D11 = C10 + 0.04
C12 - D13 =  0.048      =>      D13 = C12 - 0.048
C39 - D40 = -0.183      =>      D40 = C39 + 0.183
C42 - D43 = -0.325      =>      D43 = C42 + 0.325
```

The equations in the left-hand column follow the format of Equation 1, with the "C" term referring to the comparator edge and the accompanying number referring to the pin number. Similarly, the "D" term refers to the drive edge and the accompanying number refers to the pin number. The equations in the right-hand column correspond to the equations in the left-hand column, but they are re-arranged with respect to the drive edge term "D".

Figure 4:
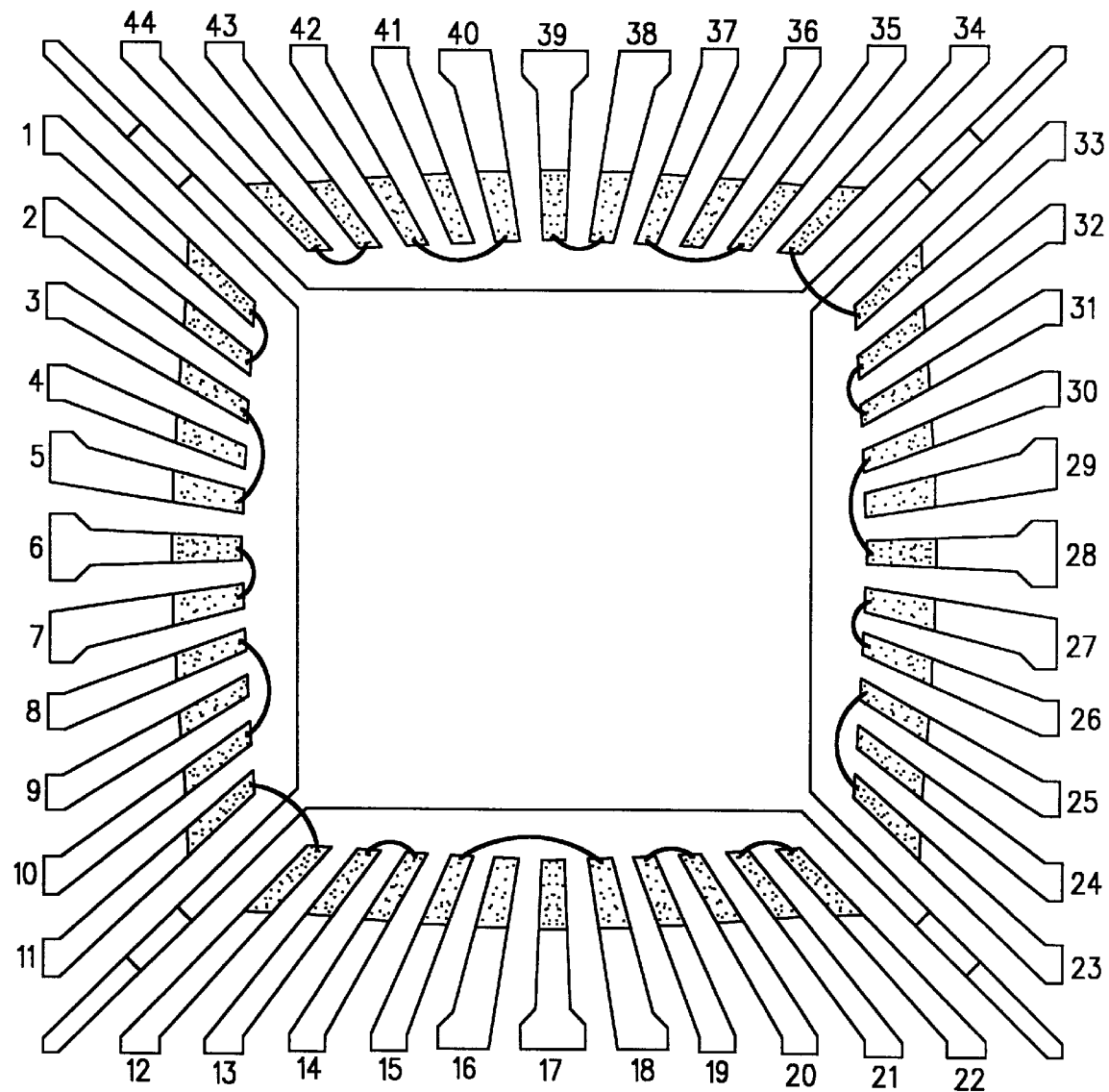
FIG. 4 illustrates a second set of shorted signal pads in accordance with an example describing an embodiment of the invention.
Figure 5:
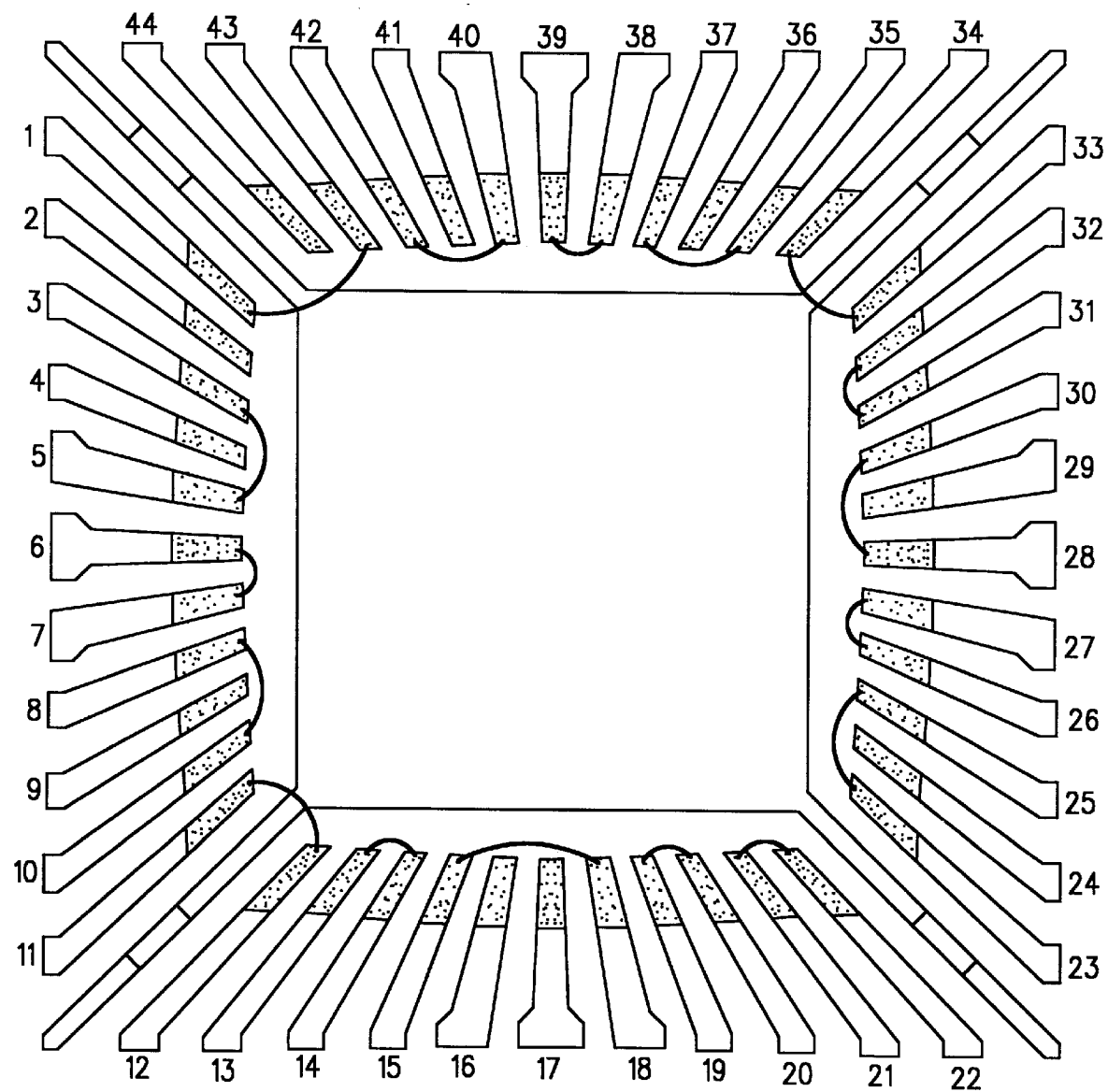
FIG. 5 illustrates a bridge connection between signal pads in accordance with an example describing an embodiment of the invention.

Returning to FIG. 2, the next processing step is to measure the time delays between a second set of shorted pads (step 52). FIG. 4 illustrates a set of shorted connections that are used for this purpose. Using Equation 1, the connections shown in FIG. 4, and actual measured results (in nanoseconds), the following equations can be written:

```
C2  - D1  = -0.326      =>      C2  - D1  - 0.326
C5  - D3  = -0.282      =>      C5  = D3  - 0.282
C7  - D6  = -0.106      =>      C7  = D6  - 0.106
C10 - D8  = -0.315      =>      C10 = D8  - 0.315
C12 - D11 = -0.15       =>      C12 = D11 - 0.15
C14 - D13 = -0.172      =>      C14 = D13 - 0.172
.
.
C42 - D40 = -0.216      =>      C42 = D40 - 0.216
C44 - D43 = -0.271      =>      C44 = D43 - 0.271
```

Since there are more variables than equations available, one variable can be selected to be the independent variable and the rest of the variables can be expressed in terms of this independent variable. For example, if D1 is chosen to be the independent variable, then we can derive the following equations from the previous list of equations:

```
C2  = D1  - 0.326
D3  = C2  + 0.337 = D1 - 0.326 + 0.337
C5  = D3  - 0.282 = D1 - 0.326 + 0.337 - 0.282
D6  = C5  + 0.106 = D1 - 0.326 + 0.337 - 0.282 + 0.106
C7  = D6  - 0.106 = D1 - 0.326 + 0.337 - 0.282 + 0.106 - 0.106
D8  = C7  + 0.029 = D1 - 0.326 + 0.337 - 0.282 + 0.106 - 0.106 +
                         0.029
.
.
.
D43 = C42 + 0.325 = D1 + . . . + . . . + 0.325
C44 = D43 - 0.271 = D1 + . . . + . . . + 0.325 - 0.271
```

The expressions listed above describe the placements of (N/2–1) edges, relative to the driver edge of Pin 1, where N is the total number of driver and comparator edges being used in the test system.

Similar equations can be derived by reversing the measurements. That is, for the first set of shorted pads shown in FIG. 3, making each comparator edge a driver edge and vice versa. This operation results in the following equations:

```
C1  - D44 = -0.073      =>      C1  = D44 - 0.073
C3  - D2  = -0.194      =>      C3  = D2  - 0.194
C6  - D5  = -0.04       =>      C6  = D5  - 0.04
C8  - D7  =  0.015      =>      C8  = D7  + 0.015
.
.
.
C43 - D42 = -0.073      =>      C43 = D42 - 0.073
```

Similar measurements are made for the second set of shorted pads shown in FIG. 4. This results in the following:

```
C1  - D2  = -0.04       =>      D2  = C1  + 0.04
C3  - D5  = -0.128      =>      D5  = C3  + 0.128
C6  - D7  = -0.073      =>      D7  = C6  + 0.073
C8  - D10 = -0.084      =>      D10 = C8  + 0.084
C11 - D12 = -0.018      =>      D12 = C11 + 0.018
C13 - D14 = -0.007      =>      D14 = C13 + 0.007
.
.
.
C43 - D44 = -0.216      =>      D44 = C43 + 0.216
```

Now, if C1 is chosen to be the independent variable, the following equations can be derived from the foregoing equations:

```
D2  = C1  - 0.04
C3  = D2  - 0.194 = C1 - 0.004 - 0.194
D5  = C3  + 0.128 = C1 - 0.004 - 0.194 + 0.128
.
.
.
C43 = D42 - 0.073 = C1 + . . . + . . . + . . . - 0.073
D44 = C43 + 0.216 = C1 + . . . + . . . + . . . - 0.073 + 0.216
```

Since there are 2 independent sets of equations describing the placement of all edges—one relative to D1 and one relative to C1, a bridging mechanism is used to relate any driver or comparator edge to one reference edge. Thus, the next processing step shown in FIG. 2 is to obtain a bridge time delay (step 54). By way of example, the bridge time delay is measured between pins 43 and 1. FIG. 4 illustrates a shorting block connection between these pins. Assuming that Pin 43 (D43) is driving Pin 1 (C1) to obtain a measurement of −0.304 nanoseconds, the following equation (Equation 2) can be derived to relate the comparator edge of Pin 1 to the driver edge of Pin 1:

$$C1-D43=-0.304 => C1=D43-0.304 => C1=D1+. .+0.325-0.304$$

At this point, an arbitrary clock reference edge may be defined (step 56 of FIG. 2). For example, suppose the clock reference edge is defined as D1=0. This value may be used in the foregoing equations to generate a set of skew values (step 58 of FIG. 2). Skew values calculated from the foregoing equations and a reference edge of D1=0 are shown in FIG. 6.

Values D1through C44, the top half of the table values in FIG. 6, are derived from a reference edge of D1=0. The first entry in the table of FIG. 6 is D1=0. The second value in the table of FIG. 6 is C2. The value C2 is calculated from the equation given above: C2=D1−0.326=0−0.326=−0.326. The third value in the table is D3. The value D3 is calculated from the equation given above: D3=C2+0.337=−0.326+0.337=0.011. The fourth value in the table is C5. The value C5 is calculated from the equation given above: C5=D3−0.282=0.011−0.282=−0.271. The remaining values are calculated in the same manner.

The bottom half of the table, values C1–D44, are derived using the foregoing equations and a calculated C1 value from Equation 2. That is, C1=D43−0.304=−0.329−0.304=−0.633. The next value in the bottom half of the table is D2. D2 is calculated from the equation given above: D2=C1+0.04=−0.633+0.04=−0.593. The next value is C3. C3 is calculated from the equation given above: C3=D2 −0.194= −0.593−0.194=−0.787. The remaining values are calculated in the same manner.

The calculated skew values can now be used to generate an overall tester accuracy value (step 60 of FIG. 2). The overall tester accuracy value is equivalent to the difference between the maximum and minimum skew values. Relying upon the example values of FIG. 6, this results in an overall tester accuracy value of 1.506 (Maximum Skew of 0.011 minus Minimum skew of −1.495=1.506). Observe that the overall tester accuracy value is constant and independent of the reference edge (D1) value which is selected.

Returning now to FIG. 2, the overall tester accuracy value is used to modify the operation of the electronic device test equipment (step 62). For example, the guard band processor 38 may be used to define a functional device guard band with respect to the overall tester accuracy value. Thereafter, the electronic device test equipment is operated to identify an electronic device that does not function within the functional device guard band. In other words, the testing programs 34 are operated in connection with the guard band value established by the guard band processor 38.

The calibration routine 40 may also be used to compare the overall tester accuracy value to an accuracy threshold value. The calibration routine 40 executes calibration operations on the electronic device test equipment when the overall tester accuracy value exceeds the accuracy threshold value.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

We claim:

1. A method of operating electronic device test equipment, said method comprising the steps of:

identifying a first set of time delays between a first set of electrically shorted test pads;

measuring a second set of time delays between a second set of electrically shorted test pads;

obtaining a bridge time delay between a third set of electrically shorted test pads, said third set of electrically shorted test pads being selected such that said third bridge time delay characterizes the timing relationship between said first set of time delays and said second set of time delays;

defining a clock reference edge;

generating skew values based upon said first set of time delays, said second set of time delays, said bridge time delay, and said clock reference edge;

calculating an overall tester accuracy value from a most negative skew value and a most positive skew value of said skew values; and modifying the operation of said electronic device test equipment in response to said overall tester accuracy value.

2. The method of claim 1 wherein said modifying step includes the steps of:

defining a functional device guard band with respect to said overall tester accuracy value; and operating said electronic device test equipment to identify tested electronic devices that do not function within said functional device guard band.

3. The method of claim 1 wherein said modifying step includes the steps of:

comparing said overall tester accuracy value to an accuracy threshold value; and performing calibration operations on said electronic device test equipment when said overall tester accuracy value exceeds said accuracy threshold value.

4. A method executed by electronic device test equipment under the control of a program, said electronic device test equipment including a memory for storing said program, said method comprising the steps of:

generating skew values based upon a first set of time delays between a first set of electrically shorted test pads, a second set of time delays between a second set of electrically shorted test pads, a bridge time delay between a third set of electrically shorted test pads, and a clock reference edge;

calculating an overall tester accuracy value from a most negative skew value and a most positive skew value of said skew values; and modifying the operation of said electronic device test equipment in response to said overall tester accuracy value.

5. The method of claim 4 wherein said modifying step includes the steps of:

defining a functional device guard band with respect to said overall tester accuracy value; and operating said electronic device test equipment to identify tested electronic devices that do not function within said functional device guard band.

6. The method of claim 4 wherein said modifying step includes the steps of:

comparing said overall tester accuracy value to an accuracy threshold value; and performing calibration operations on said electronic device test equipment when said overall tester accuracy value exceeds said accuracy threshold value.

7. A computer readable memory that can be used to direct a computer to function in a specified manner, comprising:

a first set of instructions to generate skew values based upon a first set of time delays between a first set of electrically shorted test pads, a second set of time delays between a second set of electrically shorted test pads, a bridge time delay between a third set of electrically shorted test pads, and a clock reference edge;

a second set of instructions to calculate an overall tester accuracy value from a most negative skew value and a most positive skew value of said skew values; and a third set of instructions to modify the operation of electronic device test equipment in response to said overall tester accuracy value.

8. The apparatus of claim 7 wherein said third set of instructions include:

a fourth set of instructions to define a functional device guard band with respect to said overall tester accuracy value; and a fifth set of instructions to operate said electronic device test equipment to identify tested electronic devices that do not function within said functional device guard band.

9. The apparatus of claim 7 wherein said third set of instructions include:

a sixth set of instructions to compare said overall tester accuracy value to an accuracy threshold value; and a seventh set of instructions to perform calibration operations on said electronic device test equipment when said overall tester accuracy value exceeds said accuracy threshold value.

\* \* \* \* \*